United States Patent

Goell et al.

[11] 3,936,855
[45] Feb. 3, 1976

[54] LIGHT-EMITTING DIODE FABRICATION PROCESS

[75] Inventors: James Emanuel Goell, Roanoke, Va.; Yet-Zen Liu, Fort Wayne, Ind.

[73] Assignee: International Telephone and Telegraph Corporation, Nutley, N.J.

[22] Filed: Aug. 8, 1974

[21] Appl. No.: 495,697

[52] U.S. Cl. .................. 357/17; 357/18; 357/16; 357/55
[51] Int. Cl.² ............................ H01L 33/00
[58] Field of Search .................... 357/17, 18, 16, 55

[56] References Cited
UNITED STATES PATENTS

| | | | |
|---|---|---|---|
| 3,677,836 | 7/1972 | Lorenz | 148/171 |
| 3,752,713 | 8/1973 | Sakuta | 148/171 |
| 3,833,435 | 9/1974 | Logan | 156/11 |

OTHER PUBLICATIONS
*I.B.M. Tech. Bull.,* Vol. 15, No. 1, June 1972, p. 147, article by Potemski et al.

*Primary Examiner*—Martin H. Edlow
*Attorney, Agent, or Firm*—John T. O'Halloran; Menotti J. Lombardi, Jr.

[57] ABSTRACT

A method and structure are provided for the simplified batch fabrication of Gallium Arsenide-Aluminum Gallium Arsenide lightemitting diodes. A high aluminum content AlGaAs layer is formed on the GaAs substrate layer to provide an etch resistant mask, and an etchant is employed which preferentially etches the GaAs. This permits simultaneous etching of the substrate to form a plurality of like devices on a common semiconductor wafer in a repeatable low-cost batch process.

11 Claims, 7 Drawing Figures

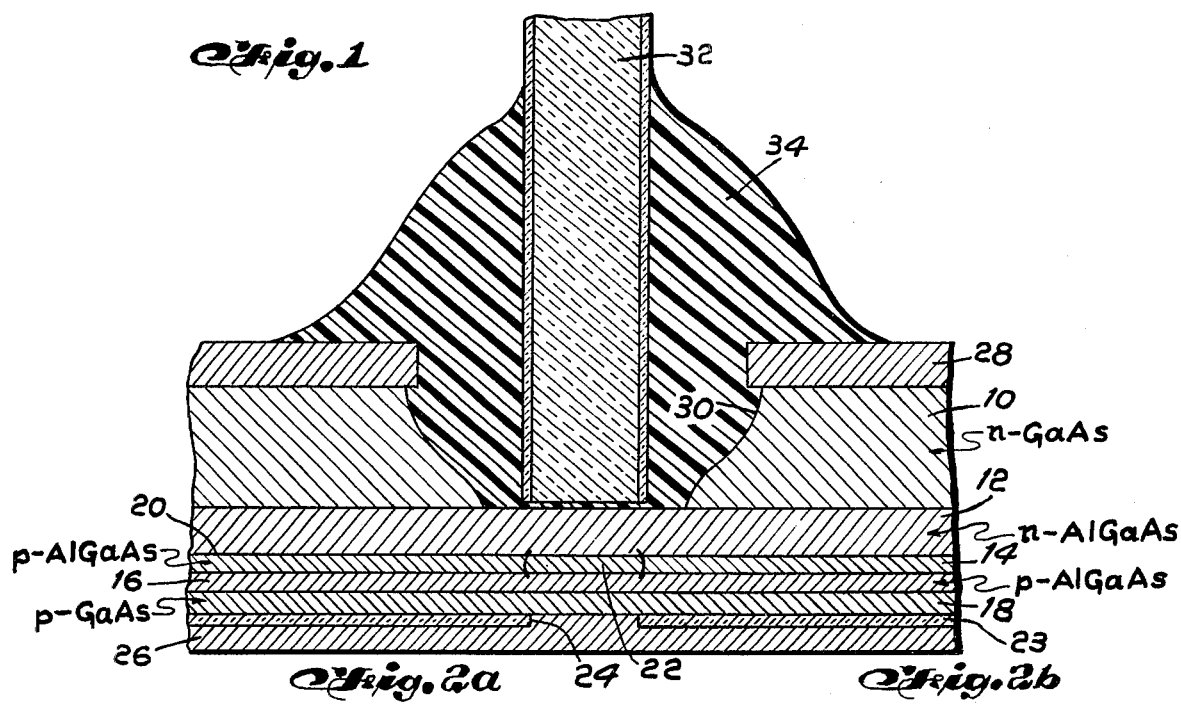
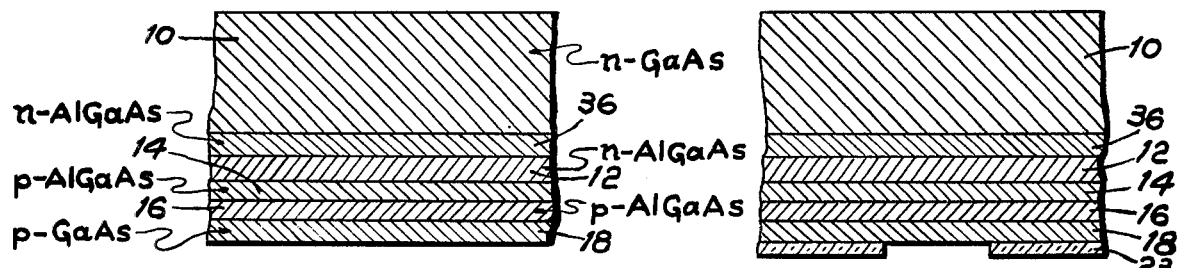
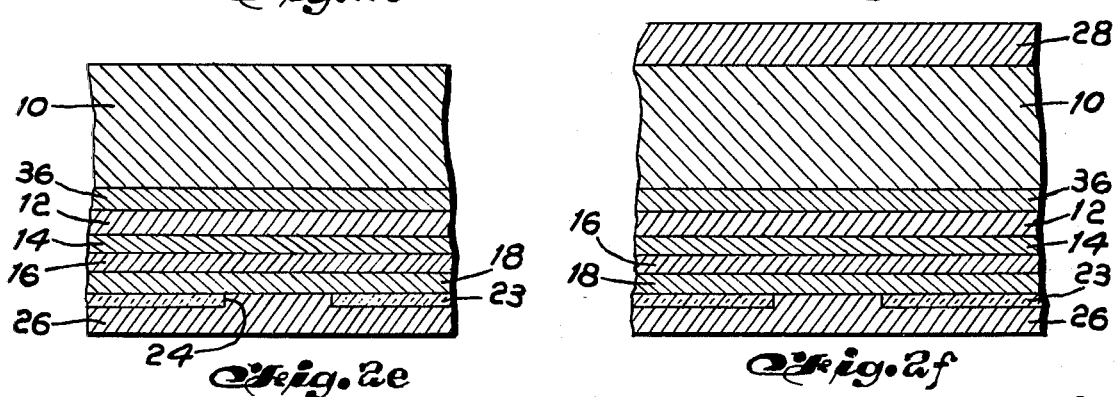
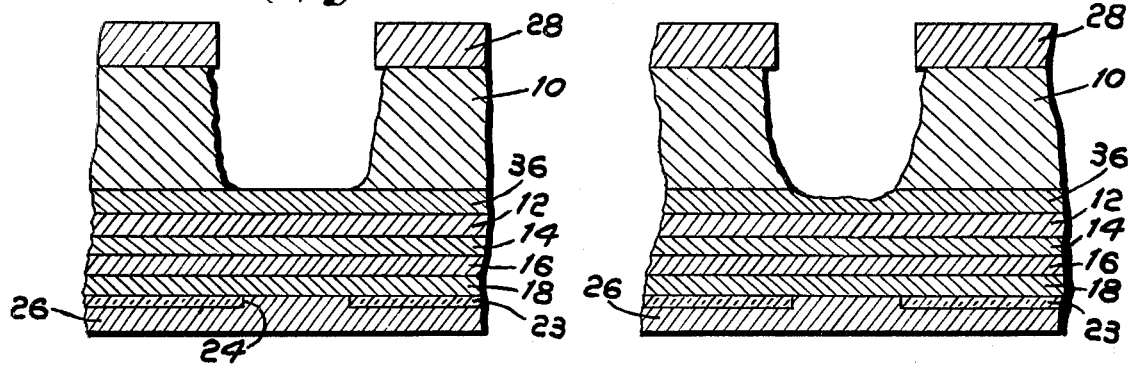

LIGHT-EMITTING DIODE FABRICATION PROCESS

BACKGROUND OF THE INVENTION

1. Field of the Invention

The present invention concerns a novel method and structure for batch processing of GaAs-AlGaAs light-emitting diodes.

2. Description of the Prior Art

Light-emitting diodes having a GaAs-AlGaAs double heterostructure, such as described in an article by C. A. Burrus in Proceedings of the IEEE, Feb. 1972, pages 231–232, are known to make efficient light sources for optical communications systems. In the conventional fabrication of these devices, the diodes are partially processed on a common wafer, which is cut into individual dice for mounting and further fabrication. The step of etching the light-emitting "well" in the substrate is generally performed on an individual basis which must be carefully controlled and visually observed. Attempts to electrolytically etch several diodes at once on a common wafer have not been successful since short-circuits frequently occur across one diode which destroys the usefulness of the entire wafer. A recent process has been found which now permits a controlled preferential etching of a layer of GaAs material on a layer of AlGaAs which resists the etching. This is described in a co-pending U.S. application, Ser. No. 381,962 filed July 23, 1973 and assigned to the same assignee as the instant application.

SUMMARY OF THE INVENTION

It is therefore the primary object of the present invention to provide a simplified reliable method and structure for fabricating GaAs-AlGaAs light-emitting diodes which permits batch processing and etching of a plurality of diodes on a common wafer.

This is achieved by the inclusion of the diode of a high aluminum concentration AlGaAs layer over the GaAs substrate to provide an etch resistant mask for a preferential etch which substantially etches only the GaAs. The remaining layers may be successively formed in accordance with the known techniques. All of the light-emitting well holes in a plurality of diodes on a common wafer can then be etched in the substrate simultaneously in a repeatable low-cost batch process. Other objects and advantages will become apparent from the following description in cnjunction with the accompanying drawings.

BRIEF DESCRIPTION OF THE DRAWINGS

FIG. 1 shows a partial section of a GaAs-AlGaAs double heterostructure light-emitting diode which is modified in accordance with the present invention, and FIGS. 2a–2f show a partial section and the steps in the process of forming a variation of the novel light-emitting diode.

DESCRIPTION OF THE PREFERRED EMBODIMENTS

As shown in FIG. 1, a GaAs-AlGaAs double heterostructure light-emitting diode includes a first n-type GaAs substrate 10, on which are normally grown four successive liquid phase epitaxial layers 12, 14, 16, and 18, respectively of n-AlGaAs, p-AlGaAs, p-AlGaAs and p-GaAs. Layers 12 and 14 form a p-n junction region 20, with central area 22 in layer 14 providing the primary light-emitting area. The layers are formed one over the other in one run by use of standard diffusion techniques and a known horizontal sliding boat apparatus containing four melts.

A silicon oxide layer 23 is deposited over the last GaAs layer 18. Layer 23 is then masked, a contact hole 24 is formed in the oxide layer and the wafer is provided with metallized contact layers 26, 28 on the two opposite sides. The wafer is then usually scribed or cut into dice with the contact hole 24 aligned at the center. The dice are bonded to headers and a wire is bonded to the top. Lastly, a well hole is masked on the metal surface 28 and separately etched with a standard etchant for each diode to form the light-emitting well 30. Optical fiber 32 is then embedded in an epoxy resin 34 to complete the assembly. Typical thickness dimensions have been about 35 – 40 microns for GaAs substrate layer 10, 10 $\mu$m for AlGaAs layer 12, 1 $\mu$m for AlGaAs layer 14, 0.5 $\mu$m for AlGaAs layer 16 and 0.5 $\mu$m for GaAs layer 18. Layer 12 of AlGaAs normally has a concentration of aluminum of 15 to 30 percent, which is expressed in the formula: $Al_xGa_{1-x}As$, where $x$ is 0.15 to 0.30.

In the present method, the wafer is formed with a higher Al concentration in the AlGaAs layer grown on the substrate layer 10. Layer 12 preferably now has an Al concentration of from 50 to 100 percent and a correspondingly lower gallium content than the usual layer. This would be expressed in the above formula $Al_xGa_{1-x}As$, where $x$ is from about 0.5 to 1. The concentration of aluminum is thus about three times that of the usual AlGaAs layer. The high Al content layer serves as an etch resistant masking layer which permits a preferential etchant that as a mixture of hydrogen peroxide ($H_2O_2$) and ammonium hydroxide ($NH_4OH$), as described in the above mentioned prior application, to etch GaAs substrate layer 10 while the high Al content AlGaAs layer resists this etching.

In the variation shown in FIGS. 2a–2f, an additional high Al concentration (50 to 100 percent) layer 36 may be grown on substrate layer 10 before the low Al concentration (15 to 30 percent) layer 12. Where two such AlGaAs layers 36, 12 are used, layer 12 would be about 1 – 5 microns and layer 36 about 10 microns in thickness. For a single high Al concentration layer 12, such as in FIG. 1, the thickness would be about 10 – 20 microns.

The remaining layers 14, 16 and 18 are thereafter successively deposited as in FIGS. 1 and 2a, with like dimensions. FIG. 2b indicates the deposition of silicon oxide layer 23 which is masked and etched in the standard manner. This is metallized with metal contact layer 26, as in FIG. 2c, and another metal contact layer 28 is applied on the other side, as in FIG. 2d. Layer 28 and layer 10 are then masked and etched as in FIG. 2e. A commercially available etchant first etches the metal layer and the preferential etchant $H_2O_2$—$NH_4OH$ etches layer 10 down to the boundary with layer 36 which substantially resists the etching. Thus, a well hole 30 of about 150 $\mu$m diameter is formed in layer 28. A shown in FIG. 2f, the preferential etchant may have some slight effect on the AlGaAs layer 36. However, since the AlGaAs layer is transparent at the operating wavelength of the diode, slight etching of this layer is not critical. All of the diodes formed on a common wafer can thus now have well 30 etched simultaneously by batch fabrication in a repeatable low-cost process rather than requiring individual processing.

While only two embodiments have been illustrated and described, it is to be understood that other variations may be made in the particular configuration and method without departing from the scope of the invention as set forth in the appended claims.

What is claimed is:

1. A gallium arsenide-aluminum gallium arsenide light-emitting diode comprising, a GaAs substrate layer of a first conductivity type, said GaAs layer being capable of being etched by a given etchant, a first AlGaAs layer of said first conductivity type on said substrate layer, said first AlGaAs layer having a sufficiently high concentration of aluminum so that said first AlGaAs layer is resistant to etching by said given etchant, a first AlGaAs layer of a second conductivity type over said first AlGaAs layer of said first type, a second AlGaAs layer of said second conductivity type on said first AlGaAs layer of said second type, and a GaAs layer of said second conductivity type on said second AlGaAs layer of said second type.

2. The device of claim 1 wherein said first AlGaAs layer of said first type includes an aluminum concentration according to the formula $Al_xGa_{1-x}As$ where x is in the range of from 0.5 to 1.0.

3. The device of claim 2 wherein said etchant includes a mixture of hydrogen peroxide and ammonium hydroxide.

4. The device of claim 2 including a junction of opposite conductivity types between said first AlGaAs layer of said second type and said first AlGaAs layer of said first type, a silicon oxide layer having a contact hole on said GaAs layer of said second type, a first metallic contact layer on said silicon oxide layer, a second metallic contact layer on the opposite side of said GaAs substrate layer, and a light emittng well hole in said second metallic contact layer and in said GaAs substrate layer.

5. The device of claim 2 wherein said first AlGaAs layer of said first type includes a second AlGaAs layer of said first type of a lower aluminum concentration on said first AlGaAs layer of high aluminum, said first AlGaAs layer of said second type forming a junction of opposite conductivity types with said second AlGaAs layer of said first type.

6. A method of making gallium arsenide-aluminum gallium arsenide light-emitting diodes comprising the steps of:

forming a first GaAlAs layer of a fist conductivity type on a substrate layer of GaAs of a first conductivity type, said GaAs layer being capable of being etched by a given etchant, said first AlGaAs layer having a sufficiently high concentration of aluminum so that said first AlGaAs layer is resistant to etching by said given etchant, forming a first AlGaAs layer of a second conductivity type over said first AlGaAs layer of said first type, forming a second AlGaAs layer of said second conductivity type on said first AlGaAs layer of said second type, forming a GaAs layer of a second conductivity type on said second AlGaAs layer of said second type, forming a silicon oxide layer on said GaAs layer of said second type, forming a contact hole in said silicon oxide layer, forming metallic contact layers respectively on said silicon oxide layer and on the opposite surface of said substrate layer of GaAs, masking and etching a hole in said metal layer on said opposite surface, and etching a hole in said substrate layer with an etchant which preferentially etches GaAs but substantially does not etch said high aluminum concentration AlGaAs layer.

7. The method of claim 6 wherein said first AlGaAs layer of said first type includes an aluminum concentration according to the formula $Al_xGa_{1-x}As$ where $x$ is in the range of from 0.5 to 1.0.

8. The method of claim 7 wherein said preferential etchant includes a mixture of hydrogen peroxide and ammonium hydroxide.

9. The method of claim 7 wherein a second AlGaAs layer of said first type of a lower aluminum concentration is formed on said first AlGaAs layer of said first type, said first AlGaAs layer of said second type being formed on said second AlGaAs layer of said first type and forming a junction of opposite conductivity types therewith.

10. The method of claim 7 wherein said first AlGaAs layer of said first type and said first AlGaAs layer of said second type form a junction of opposite conductivity types.

11. The method of claim 7 wherein a plurality of like holes are etched in said metal layer on said opposite surface and in said substrate layer in simultaneous etching steps to form a plurality of said diodes on a common wafer.

* * * * *